US012796577B2

(12) United States Patent
Arora et al.

(10) Patent No.: US 12,796,577 B2
(45) Date of Patent: Nov. 10, 2026

(54) ISOLATED SEMICONDUCTOR PACKAGE WITH HV ISOLATOR ON BLOCK

(71) Applicant: Texas Instruments Incorporated, Dallas, TX (US)

(72) Inventors: Vivek K Arora, San Jose, CA (US); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 313 days.

(21) Appl. No.: 18/603,047

(22) Filed: Mar. 12, 2024

(65) Prior Publication Data

US 2024/0222237 A1 Jul. 4, 2024

Related U.S. Application Data

(62) Division of application No. 17/502,706, filed on Oct. 15, 2021, now Pat. No. 11,929,311.

(51) Int. Cl.
*H10W 90/00* (2026.01)
*H01F 27/28* (2006.01)
(Continued)

(52) U.S. Cl.
CPC ...... *H10W 90/811* (2026.01); *H01F 27/2804* (2013.01); *H10W 40/253* (2026.01); *H10W 70/417* (2026.01); *H10W 70/481* (2026.01); *H10W 72/073* (2026.01); *H10W 74/01* (2026.01); *H10W 74/111* (2026.01); *H01F 2027/2809* (2013.01); *H10W 72/075* (2026.01); *H10W 72/884* (2026.01); *H10W 90/755* (2026.01); *H10W 90/759* (2026.01)

(58) Field of Classification Search
CPC ............... H01L 23/49575; H01L 21/56; H01L 23/3107; H01L 23/3738; H01L 23/49513; H01L 23/49562; H01L 24/48; H01L 24/73; H01L 24/92; H01L 2224/48175; H01L 2224/48195; H01L 2224/73265; H01L 2224/92247; H01F 27/2804; H01F 2027/2809
USPC ........................................................ 257/676
See application file for complete search history.

(56) References Cited

U.S. PATENT DOCUMENTS

| | | | |
|---|---|---|---|
| 6,437,981 B1 | 8/2002 | Newton et al. | |
| 6,603,072 B1 * | 8/2003 | Foster .................. | H10W 90/00 174/536 |

(Continued)

*Primary Examiner* — Eva Y Montalvo
(74) *Attorney, Agent, or Firm* — Ronald O. Neerings; Charles F. Koch

(57) ABSTRACT

A power converter package includes a leadframe including first and second die pads, and supports connected to first leads, and second leads. A first semiconductor die including first bond pads is on the first die pad, and a second semiconductor die including second bond pads is on the second die pad. A transformer stack includes a top magnetic sheet and a bottom magnetic sheet on respective sides of a laminate substrate that includes a coil within, and coil contacts. A silicon block is attached to the bottom magnetic sheet and edges of the laminate substrate are attached to the supports. Bond wires are between the first bond pads and the second leads, the second bond pads and the second leads, and the first and second bond pads and the coil contacts. Mold encapsulates the respective semiconductor and the transformer stack. A bottom of the silicon block is exposed from the mold.

23 Claims, 8 Drawing Sheets

(51) Int. Cl.

| | |
|---|---|
| ***H10W 40/25*** | (2026.01) |
| ***H10W 70/40*** | (2026.01) |
| ***H10W 72/00*** | (2026.01) |
| ***H10W 74/01*** | (2026.01) |
| ***H10W 74/10*** | (2026.01) |

(56) References Cited

U.S. PATENT DOCUMENTS

| | | | | |
|---|---|---|---|---|
| 11,081,472 | B2 * | 8/2021 | Noquil | H01L 23/3185 |
| 2021/0305207 | A1 * | 9/2021 | Arora | H01L 23/3735 |
| 2023/0135932 | A1 * | 5/2023 | Khanolkar | H02M 3/003<br>257/676 |
| 2023/0268826 | A1 * | 8/2023 | Yan | H02M 3/003<br>363/178 |

* cited by examiner

ISOLATED SEMICONDUCTOR PACKAGE WITH HV ISOLATOR ON BLOCK

CROSS-REFERENCE TO RELATED APPLICATIONS

The present application is a divisional of co-pending application Ser. No. 17/502,706 filed Oct. 15, 2021, titled "Isolated Semiconductor Package with HV Isolator on Block," and is incorporated herein by reference in its entirety.

FIELD

This Disclosure relates to isolated power converter packages, such as DC-DC converter packages.

BACKGROUND

Some packaged semiconductor devices comprise a multi-chip module (MCM) package which includes two or more IC die within the package, that are generally positioned lateral to one another. Electrical connections between the respective IC die when laterally positioned on die pads within a MCM generally include bond wires connecting to inner located bond pads on the respective IC die including in some cases die-to-die bond wires. One known MCM arrangement is a Small Outline Integrated Circuit (SOIC) package.

One MCM package arrangement is known as an isolated DC/DC converter package which comprises a first IC die and a second IC die and a transformer generally coupled together by bond wires. Some isolated semiconductor power packages, for example the Texas Instruments Incorporated (TI) UCC12050 that is described as being a high-density/low-EMI, 5 KVRMS reinforced isolation DC-DC converter module is one example of an isolated power converter package that comprises a transformer as the HV isolator between first and second semiconductor die. For example, the isolated power converter package in the case of an isolated DC/DC power converter package can comprise an SOIC package which can provide 500 mW to 1 W (typical) of isolated DC output power at a high-power conversion efficiency. The thermal dissipation capability of such DC\DC converter packages can limit them from supporting high power applications, such as >1 W applications, for example for medical equipment, industrial machinery, automotive, and aerospace.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize isolated power converter packages, such as isolated DC/DC converter modules, can have their possible applications extended provided the isolated power converter package can provide improved cooling. Disclosed aspects include isolated power converter packages that include a silicon block under the transformer stack which comprises magnetic sheets on respective sides of a laminate substrate that includes at least one coil within a dielectric material. The silicon block which generally includes a dielectric layer on a top and a bottom side, such as comprising silicon oxide, which functions as a thermally conductive and electrically isolating interposer layer configured for improving the transfer of heat out from a bottom side of the transformer stack.

The transformer stack being the hottest component in the isolated power converter package is physically attached generally by a thermally conductive adhesive material to the silicon block which is exposed from the mold compound at a bottom side of the isolated power converter package. This silicon block under the transformer stack enables the heat from the transformer stack generated during operation to be spread through the silicon block, then to a thermal plane under the silicon block generally provided by a printed circuit board (PCB) that the isolated power converter package may be assembled onto, and finally to the ambient.

Disclosed aspects include an isolated power converter package including a leadframe including a first die pad and a second die pad, supports for supporting a transformer stack connected to a first plurality of leads, and a second plurality of leads. A first semiconductor die including first bond pads is on the first die pad and a second semiconductor die including second bond pads is on the second die pad. A transformer stack includes a top side magnetic sheet and a bottom side magnetic sheet on respective sides of a laminate substrate comprising a coil embedded within a dielectric material.

A silicon block is attached to the bottom side magnetic sheet and edges of the laminate substrate are attached to the supports. There are bond wires between the first bond pads and the second plurality of leads, between the second bond pads and the second plurality of leads, between the first bond pads and the coil contacts, and between the second bond pads and the coil contacts. A mold compound provides encapsulation for the first semiconductor die, the second semiconductor die, and for the transformer stack. A bottom side of the silicon block is exposed from the mold compound at a bottom side of the semiconductor package. The first and second semiconductor die can respectively comprise a gate driver and a power FET module comprising at least one power FET typically comprising a first power FET and a second power FET.

BRIEF DESCRIPTION OF THE DRAWINGS

Reference will now be made to the accompanying drawings, which are not necessarily drawn to scale, wherein.

DETAILED DESCRIPTION

Figure 1A:
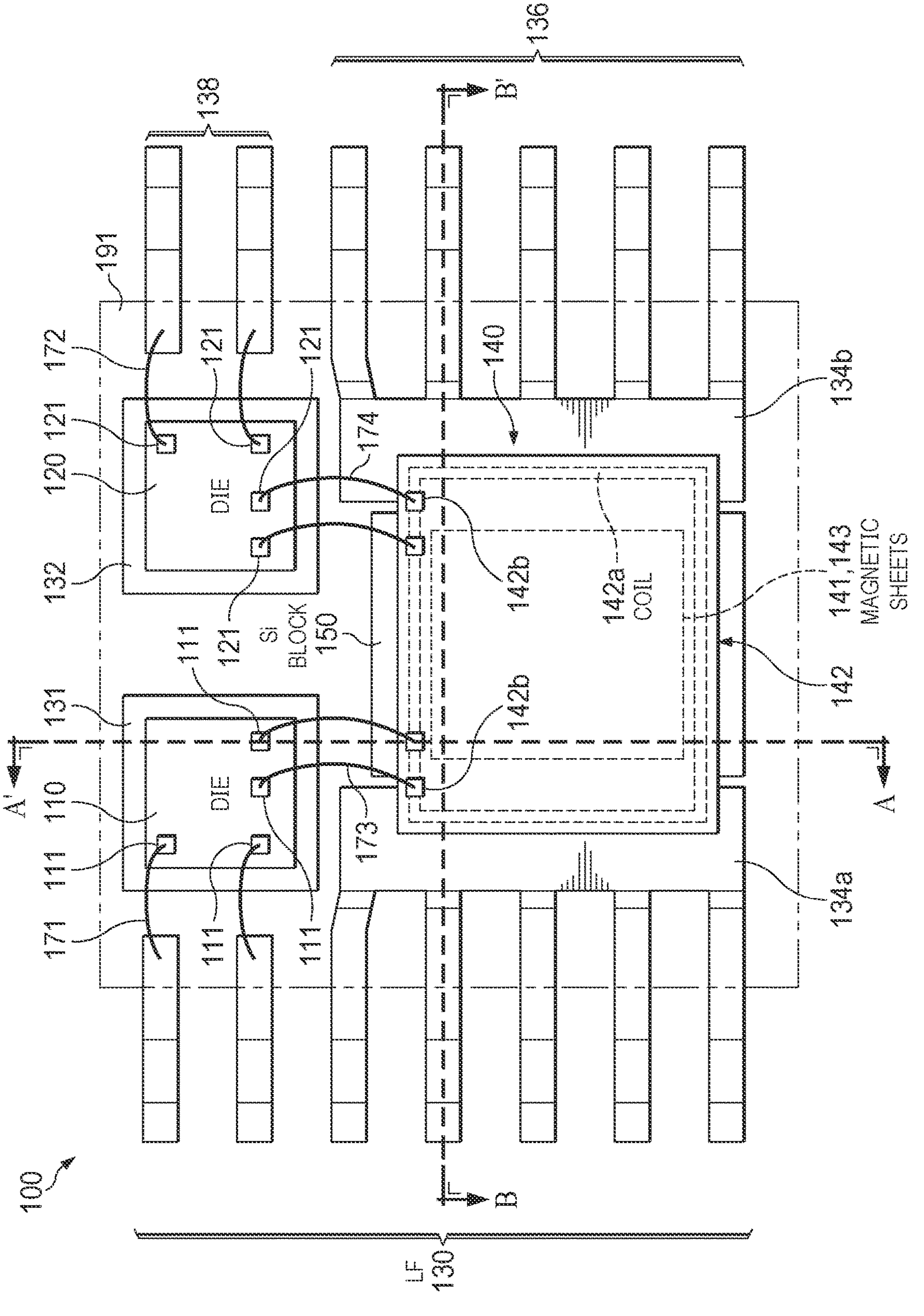
FIG. 1A is a top view looking through the mold compound of an example isolated power converter package comprising a leadframe including first and second die pads having first and second semiconductor die mounted thereon, and supports. There is a transformer stack comprising a top side magnetic sheet and a bottom side magnetic sheet on respective sides of a laminate substrate. There is a silicon block attached by an adhesive material to the bottom side magnetic sheet. The silicon block is exposed from the mold compound at a bottom side of the isolated power converter package. The silicon block under the transformer stack is for enhanced cooling of the transformer.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

FIG. 1A is a top view looking through the mold compound 191 of an example isolated power converter package 100 comprising a leadframe 130 including a first die pad 131 and a second die pad 132 having a first semiconductor die 110 including first bond pads 111 on the first die pad 131 and a second semiconductor die 120 including second bond pads 121 on the second die pad 132. The leadframe 130 can comprise a conventional leadframe, a multi-layer leadframe such as a molded interconnect substrate (MIS), or a routable leadframe. The leadframe 130 also includes a first plurality of leads 136, and a second plurality of leads 138, and supports 134*a*, and 134*b* for supporting a transformer stack 140 that is connected to respective sides of the first plurality of leads 136. The transformer stack 140 may also be referred to as being a laminate transformer.

The transformer stack 140 comprises a top side magnetic sheet 141 and a bottom side magnetic sheet 143 on respective sides of a laminate substrate 142 comprising at least one coil 142*a* embedded within a dielectric material. The laminate substrate 142 includes coil contacts 142*b* positioned on its top surface. A silicon block 150 is attached to the bottom side magnetic sheet 143. The silicon block 150 generally includes a layer of silicon oxide on a top side and on a bottom side that helps ensure electrical isolation. The layer of silicon oxide generally has a thickness of 0.1 mm to 1 mm. Edges of the laminate substrate 142 are attached to the supports 134*a*, 134*b*. A dimension of the silicon block 150 in a direction normal to a length direction of the supports 134*a*, 134*b* is less than a minimum distance between the supports 134*a*, 134*b*.

There are bondwires 171 between the first bond pads 111 and the second plurality of leads 138, bond wires 172 between the second bond pads 121 and the second plurality of leads 138, bond wires 173 between the first bond pads 111 and the coil contacts 142*b*, and bond wires 174 between the second bond pads 121 and the coil contacts 142*b*. The mold compound 191 provides encapsulation for the first semiconductor die 110, for the second semiconductor die 120, and for the transformer stack 140. A bottom side of the silicon block 150 is exposed from the mold compound 191 at a bottom side of the isolated power converter package 100 which is shown in FIG. 1B described below.

The silicon block 150 being under the transformer stack 140 acts as thermal pad for the transformer stack 140 enabling the isolated power converter package 100 to be operated at a higher power level than otherwise possible. The respective magnetic sheets 141 and 143 can be glued by an adhesive to the respective sides of the laminate substrate 142. A function of the respective magnetic sheets 141 and 143 is to control the magnetic field around the coil 142*a* embedded within the laminate substrate 142.

Figure 1B:
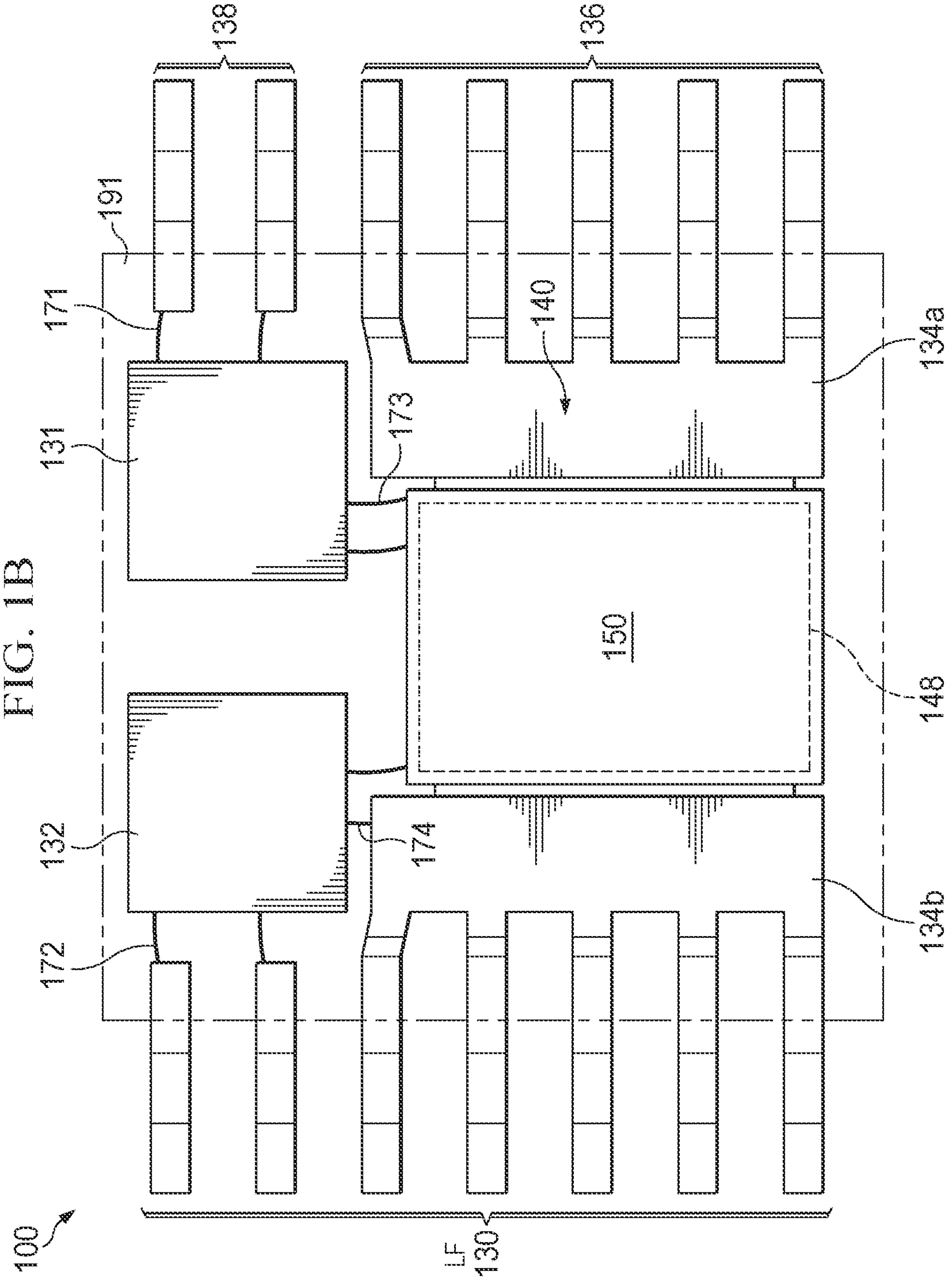
FIG. 1B is a bottom view of the isolated power converter package shown in FIG. 1A.

FIG. 1B is a bottom view of the isolated power converter package 100 shown in FIG. 1A. An adhesive material 148 is positioned between the bottom magnetic sheet 143 (see FIG. 1A) of the transformer stack 140 and the silicon block 150. The adhesive material 148 generally comprises a thermally conductive adhesive material that provides a 25° C. thermal conductivity of at least 1 W/m·K, such as at least 10 W/m·K. The adhesive material 148 can comprise a metal particle filled epoxy material, ceramic, a composite material, solder, or sintered nanoparticles.

Figure 2A:
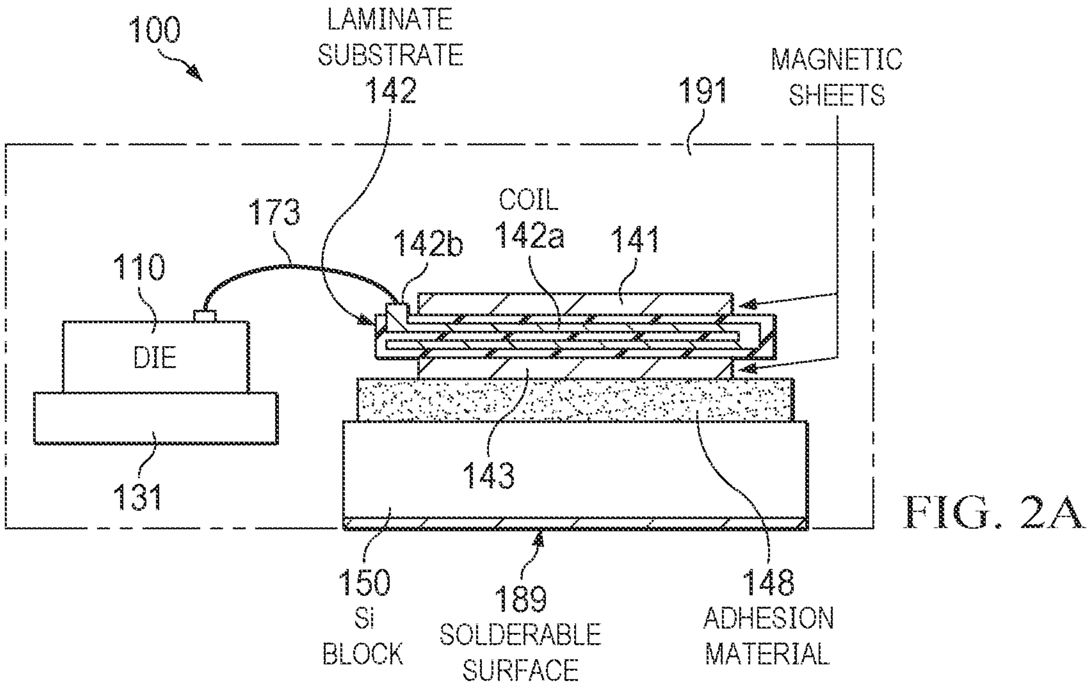
FIG. 2A is a cross-sectional view across the cut line shown as A-A' in FIG. 1A.
Figure 2B:
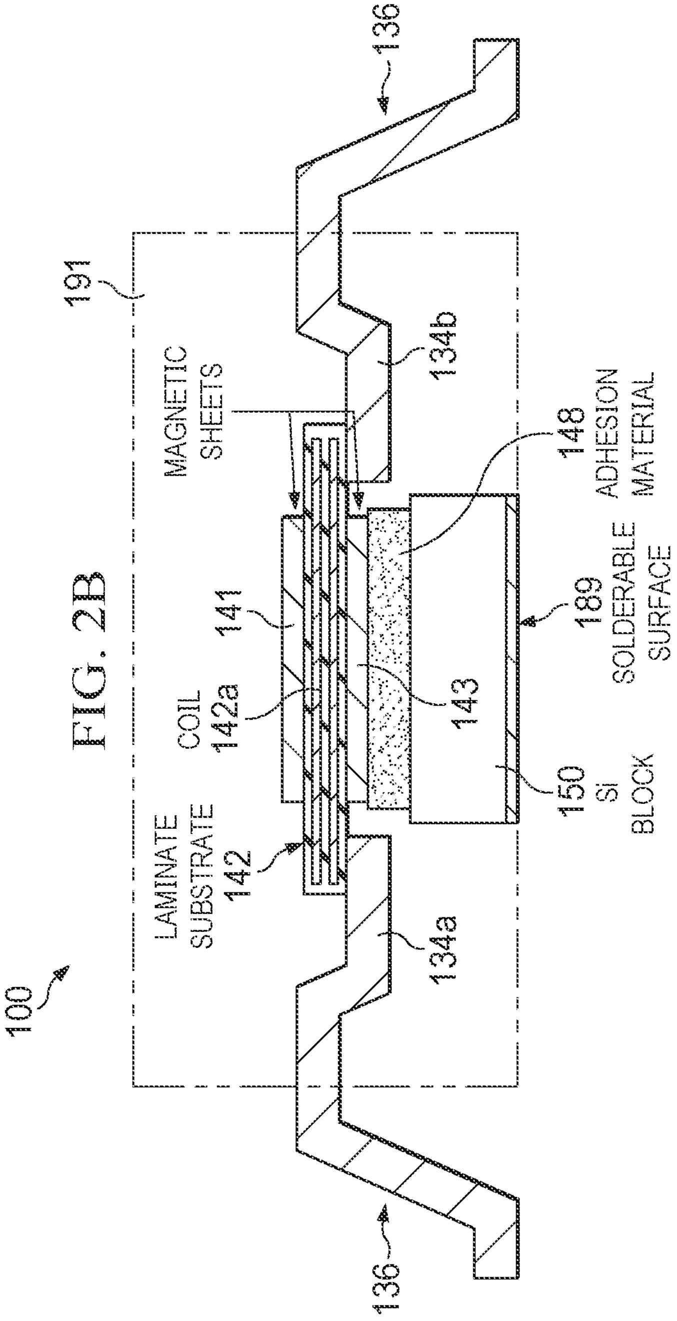
FIG. 2B is a cross-sectional view across the cut line shown as B-B' in FIG. 1A.

FIG. 2A is a cross-sectional view of the isolated power converter package 100 across the cut line shown as A-A' in FIG. 1A. The coil 142*a* can be seen to be embedded within the laminate substrate 142. The silicon block 150 on its bottom side may include a suitable solderable surface shown as 189. FIG. 2B is a cross-sectional view of the isolated power converter package 100 across the cut line shown as B-B' in FIG. 1A.

Figure 3A:
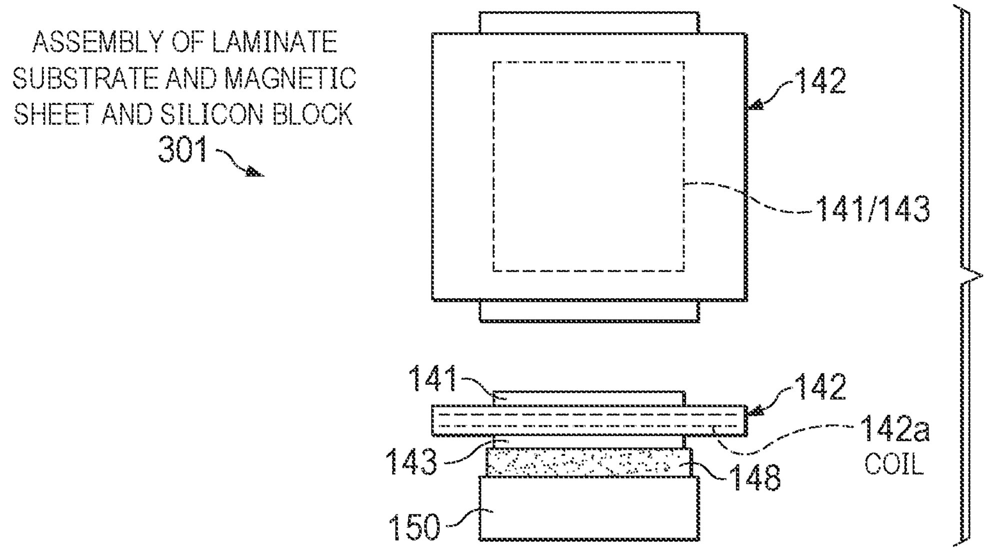
FIGS. 3A-E depict successive views of an in-process isolated power converter package corresponding to results following steps in an example method for forming a disclosed isolated power package comprising a leadframe including first and second die pads having first and second semiconductor die mounted thereon, and a transformer stack also on the leadframe. The transformer stack is connected between the first and the second semiconductor die, and is attached to a silicon block underneath which is exposed at a bottom side of the package from the mold compound.

FIGS. 3A-E depict successive views of an in-process isolated power converter package 100 corresponding to results following steps in an example method for forming a disclosed isolated power package having a silicon block 150 under the transformer stack 140 for enhanced cooling of the transformer stack. FIG. 3A shows results after step 301 comprising attaching a silicon block 150 below the bottom side magnetic sheet 143 of the transformer stack 140, where the x-dimension (corresponding to the width of the sheet) of the silicon block 150 is shown to be less than the x-dimension of the laminate substrate 142.

Figure 3B:
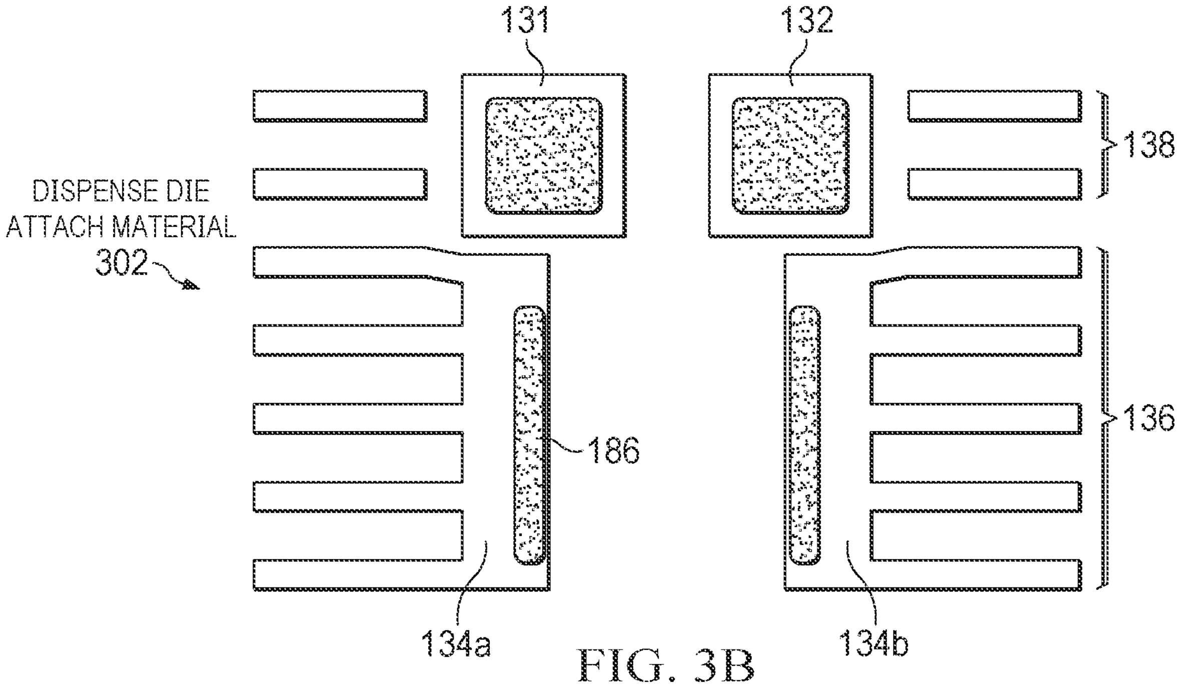
Figure 3C:
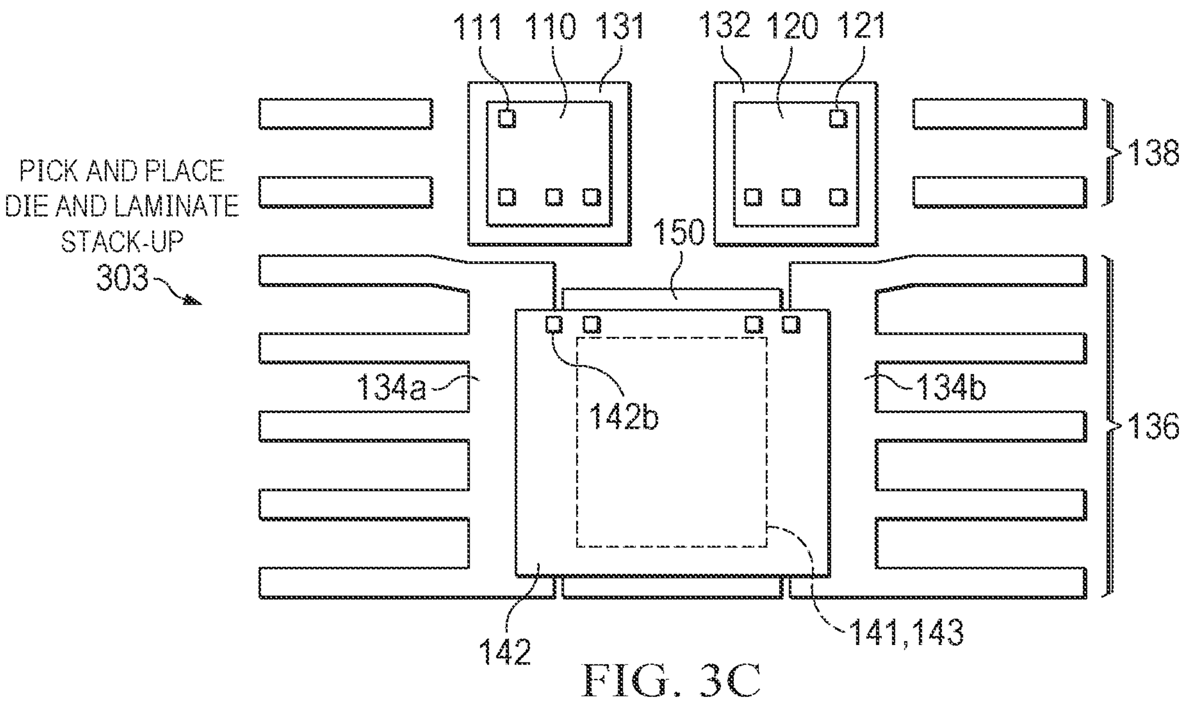
Figure 3D:
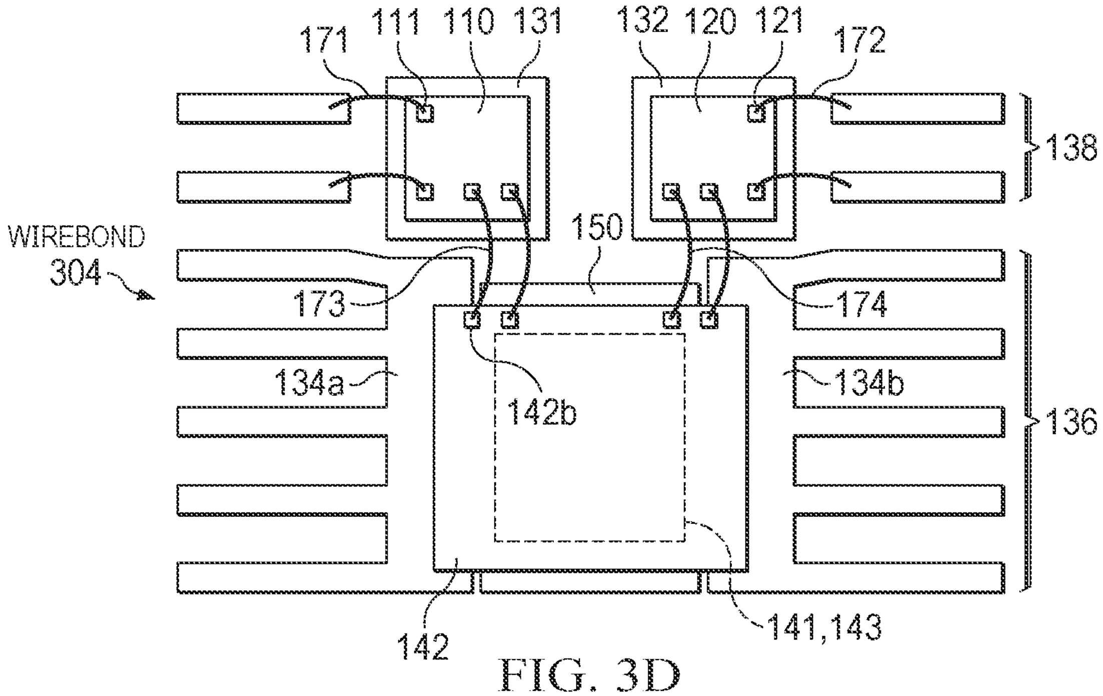
Figure 3E:
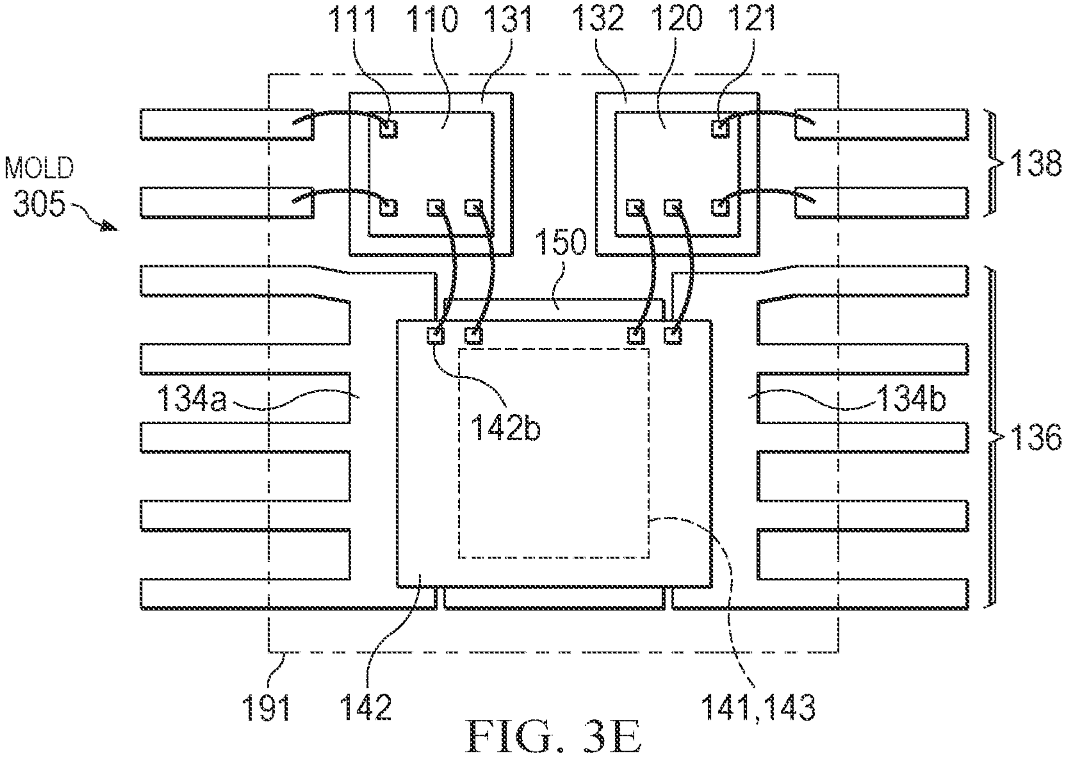

FIG. 3B shows results after step 302 comprising dispensing a die attach material 186 onto the first and second die pads 131, 132, and on the supports 134*a*, 134*b*. FIG. 3C shows results after step 303 comprising a pick and place of the first semiconductor die 110 on the first die pad 131 and second semiconductor die 120 on the second die pad 132, and the transformer stack 140 on the supports 134*a*, 134*b*. The x-dimension of the silicon block 150 being less than the x-dimension of the laminate substrate 142 enables the pick and place assembly of the transformer stack 140 having the silicon block 150 underneath so that the laminate substrate 142 rests on the supports 134*a*, 134*b* and the silicon block 150 is positioned below the supports 134*a*, 134*b*. Step 304 comprises the in-process isolated power converter package 100 shown after wirebonding step 305 in FIG. 3E which shows the in process isolated power converter package 100 after molding to form the mold compound 191.

Figure 4:
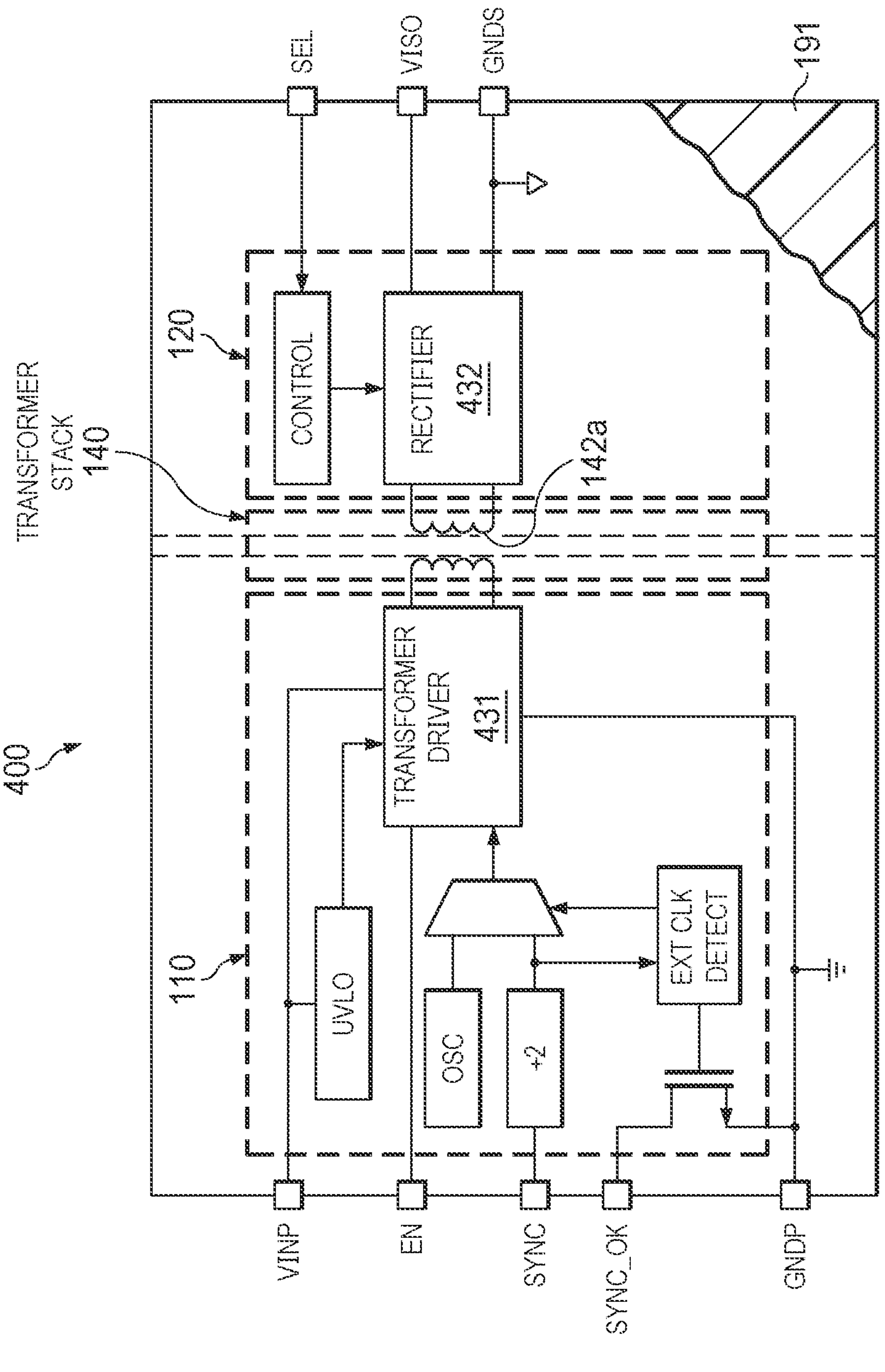
FIG. 4 shows a functional block diagram for an example isolated DC-DC converter package. The isolated DC-DC converter package comprises a leadframe with its respective pins being shown. The isolated DC-DC converter includes first and second die pads having first and second semiconductor die mounted thereon, and a transformer stack also on the supports of the leadframe, where the transformer stack is connected between the first and the second semiconductor die, and is attached to a silicon block (not visible in FIG. 4) underneath which is exposed at a bottom side of the package from the mold compound.

FIG. 4 shows a functional block diagram for an example isolated DC-DC converter package 400, where the mold is shown as 191, and only the eight pins are shown for representing the leadframe. The isolated DC-DC converter package 400 comprises a primary side including a first semiconductor die 110 that includes a transformer driver 431 and a secondary side including a second semiconductor die 120 including a rectifier 432. There is a transformer stack 140 including at least one coil 142*a* positioned between the first semiconductor die 110 and the second semiconductor die 120.

EXAMPLES

Disclosed aspects are further illustrated by the following specific Examples, which should not be construed as limiting the scope or content of this Disclosure in any way.

In the table below there is provided results from a thermal analysis using the parameter Rth (thermal resistance from the junction to the ambient) that compares the thermal performance of a baseline isolated DC/DC converter package having a transformer stack and no exposed pad as compared to a disclosed isolated DC/DC converter package having a transformer stack including an exposed silicon block 150 attached to a bottom side of the transformer stack. A reduction in Rth can be seen to be almost 26%.

| | Baseline isolated converter device - no exposed block | Disclosed isolated converter device with Exposed Si block |
|---|---|---|
| T_tranx | 61.93 | 52.36 |
| T_case | 62.03 | 33.25 |
| T_amb | 25.00 | 25.00 |
| Rth, x-amb | 68.39 | 50.66 |
| Rth % reduction | — | −25.93% |

Disclosed aspects can be integrated into a variety of assembly flows to form a variety of different isolated power converter packages and related products. Although not shown, the isolated power converter package can also comprise stacked semiconductor die, besides the laterally positioned semiconductor die generally shown. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BICMOS, and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method of assembling an isolated converter package, comprising:
   - assembling together a transformer stack comprising a top side magnetic sheet and a bottom side magnetic sheet on respective sides of a laminate substrate comprising a coil within a dielectric material, with a silicon block attached to the bottom side magnetic sheet;
   - dispensing a die attach material onto a first die pad and a second die pad and on supports for supporting the transformer stack of a leadframe, the leadframe including a first plurality of leads connected to the supports and a second plurality of leads;
   - positioning a first semiconductor die on the first die pad, a second semiconductor die on the second die pad, and the transformer stack with edges of the laminate substrate on the supports and the silicon block below the supports;
   - wirebonding between bond pads on the first semiconductor die and the second plurality of leads, between bond pads on the second semiconductor die and the second plurality of leads, between first bond pads on the first semiconductor die and contacts on the laminate substrate and between bond pads on the second semiconductor die and contacts on the laminate substrate, and
   - molding to form a mold compound providing encapsulation for the first semiconductor die, the second semiconductor die, and for the transformer stack.

2. The method of claim 1, wherein the silicon block includes a layer of silicon oxide on a top side and on a bottom side.

3. The method of claim 2, wherein the layer of silicon oxide has a thickness of 0.1 mm to 1 mm.

4. The method of claim 1, wherein the assembling together comprises utilizing a thermally conductive adhesive material between the silicon block and the bottom side magnetic sheet, wherein the thermally conductive adhesive material provides a 25° C. thermal conductivity of at least 1 W/m·K, and comprises a metal particle filled epoxy material, ceramic, a composite material, solder, or sintered nanoparticles.

5. The method of claim 1, wherein the first semiconductor die comprises a gate driver, and wherein the second semiconductor die comprises a power field effect transistor (FET) module comprising at least one power FET.

6. The method of claim 1, wherein the edges of the laminate substrate are attached to the supports by a thermally conductive adhesive material, wherein the thermally conductive adhesive material provides a 25° C. thermal conductivity of at least 1 W/m·K, and comprises a metal particle filled epoxy material, ceramic, a composite material, solder, or sintered nanoparticles.

7. The method of claim 1, wherein a dimension of the silicon block in a direction normal to a length direction of the supports is less than a minimum distance between the supports.

8. The method of claim 1, wherein the silicon block is attached to the bottom side magnetic sheet by a thermally conductive adhesive material that provides a 25° C. thermal conductivity of at least 1 W/m·K.

9. The method of claim 1, wherein a thickness of the silicon block is in a range of 0.1 mm to 1 mm.

10. A method of making an isolated converter package, comprising:
    - attaching a top side magnetic sheet and a bottom side magnetic sheet on respective sides of a laminate substrate comprising a coil within a dielectric material to form a magnetic stack;
    - attaching a silicon block to the bottom side magnetic sheet;
    - providing a first die pad and a second die pad and supports for supporting the magnetic stack;

connecting a first plurality of leads connected to the supports;

attaching a first semiconductor die to the first die pad, attaching a second semiconductor die to the second die pad, and attaching edges of the laminate substrate to the supports;

forming wirebonds between bond pads on the first semiconductor die and a second plurality of leads, between bond pads on the second semiconductor die and the second plurality of leads, between first bond pads on the first semiconductor die and contacts on the laminate substrate and between bond pads on the second semiconductor die and contacts on the laminate substrate; and encapsulating the first semiconductor die, the second semiconductor die, and the transformer stack with a molding compound.

11. The method of claim 10, wherein the silicon block includes a layer of silicon oxide on a top side and on a bottom side.

12. The method of claim 10, wherein the bottom side of the silicon block includes a solderable surface.

13. The method of claim 10, wherein the first semiconductor die comprises a gate driver, and wherein the second semiconductor die comprises a power field effect transistor (FET) module comprising at least one power FET.

14. The method of claim 10, wherein the attaching a silicon block to the bottom side magnetic sheet includes utilizing a thermally conductive adhesive material between the silicon block and the bottom side magnetic sheet, wherein the thermally conductive adhesive material provides a 25° C. thermal conductivity of at least 1 W/m·K, and comprises a metal particle filled epoxy material, ceramic, a composite material, solder, or sintered nanoparticles.

15. The method of claim 10, wherein the edges of the laminate substrate are attached to the supports by a thermally conductive adhesive material, wherein the thermally conductive adhesive material provides a 25° C. thermal conductivity of at least 1 W/m·K, and comprises a metal particle filled epoxy material, ceramic, a composite material, solder, or sintered nanoparticles.

16. The method of claim 10, wherein a dimension of the silicon block in a direction normal to a length direction of the supports is less than a minimum distance between the supports.

17. A method of forming an isolated power converter package, comprising:

forming a transformer stack comprising a top side magnetic sheet and a bottom side magnetic sheet on respective sides of a laminate substrate comprising a coil within a dielectric material, including coil contacts on a top surface of the laminate substrate;

attaching a silicon block to the bottom side magnetic sheet;

providing a leadframe including a first die pad and a second die pad, supports for supporting a transformer stack connected to a first plurality of leads, and a second plurality of leads;

attaching a first semiconductor die to the first die pad, the first semiconductor die including first bond pads and attaching a second semiconductor die to the second die pad, the second semiconductor die including second bond pads;

attaching edges of the laminate substrate to the supports;

bonding wires between the first bond pads and the second plurality of leads, between the second bond pads and the second plurality of leads, between the first bond pads and the coil contacts, and between the second bond pads and the coil contacts, and encapsulating the first semiconductor die, the second semiconductor die, and the transformer stack with a mold compound.

18. The method of claim 17, wherein the silicon block includes a layer of silicon oxide on a top side and on a bottom side.

19. The method of claim 17, wherein the bottom side of the silicon block includes a solderable surface.

20. The method of claim 17, wherein the first semiconductor die comprises a gate driver, and wherein the second semiconductor die comprises a power field effect transistor (FET) module comprising at least one power FET.

21. The method of claim 1, wherein a solderable surface on a bottom side of the silicon block is exposed from the mold compound at a bottom side of the isolated power package.

22. The method of claim 10, wherein a solderable surface on a bottom side of the silicon block is exposed from the mold compound at a bottom side of the isolated power package.

23. The method of claim 17, wherein a solderable surface on a bottom side of the silicon block is exposed from the mold compound at a bottom side of the isolated power package.

* * * * *